(12) United States Patent
Hoffman et al.

(10) Patent No.: US 6,372,623 B1
(45) Date of Patent: *Apr. 16, 2002

(54) SEMICONDUCTOR DEVICE AND METHOD OF FABRICATION

(75) Inventors: Emily Ellen Hoffman; Robert E. Terrill; Wesley Michael Wolverton, all of Carrollton, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/912,507

(22) Filed: Aug. 18, 1997

(51) Int. Cl.[7] .................................................. H01L 21/44
(52) U.S. Cl. ........................ 438/613; 438/612; 438/614
(58) Field of Search ................................. 257/778, 737, 257/738, 781, 782, 767, 768, 769; 438/612, 613, 614, 615

(56) References Cited

U.S. PATENT DOCUMENTS 5,567,981 A * 10/1996 Bhansali et al. ............. 257/781
5,648,686 A *  7/1997 Hirano et al. ................ 257/778

* cited by examiner

Primary Examiner—Kevin M. Picardat
(74) Attorney, Agent, or Firm—Gary C. Honeycutt; Fred Telecky; Arthur I. Navarro

(57) ABSTRACT

A process for the fabrication of an integrated circuit assembly, using thin film platinum metallization to provide edge-side contacts suitable for solder ball connections. Three-dimensional laser ablation may be used for patterning metal films. A multi-chip assembly may be formed using orthogonal edge-side mounting on a substrate.

8 Claims, 5 Drawing Sheets

SEMICONDUCTOR DEVICE AND METHOD OF FABRICATION

This invention relates to the fabrication and assembly of semiconductor chips, substrates, and modules, and more particularly to methods and apparatus for achieving flexible, low-cost manufacturing. Commercial and military systems today are placing increasing demands on flexible application and reliable operation, as well as on simplified manufacturing.

BACKGROUND OF THE INVENTION

Semiconductor devices have been prepared in the past using various combinations of metallization over the circuit metal contact pads. Such combinations generally have included the use of thin films of refractory metals as well as gold and palladium, which require costly patterning steps involving hazardous material and chemical waste, and also generate stress in the semiconductor chips. They furthermore severely limit the choice of soldering materials for assembly and packaging. Although platinum, with titanium as undermetal, has been proposed in 1996 ("Self-Aligned, Fluxless Flip-Chip Bonding Technology for Photonic Devices", by J. F. Kuhmann, H.-J. Hensel, D. Pech, P. Harde, and H.-G. Bach, Proc. 1996 Electronic Components and Technology Conference, May 1996), it was restricted to specialty III–V photonic devices and eutectic solder connections. For rerouting processes on semiconductor circuits, past technology offers only methods of questionable effectiveness to position the thin metal films across the sides or edges of the chip. In addition, the patterning processes for these thin metal films are expensive and generate liquid waste byproducts which must be disposed of. For forming cubes from a plurality of stacked chips, the known technology must rely on cumbersome, expensive methods. Known methods for assembling individual chips or finished cubes onto substrates often involve poorly compatible metallization and solders, with difficulty for aligning active parts and substrate.

In summary, the goal of offering for commercial and military systems cost-effective, reliable, rerouted semiconductor products, manufactured in high volume and with flexible, low-cost production methods, has remained elusive, until now.

SUMMARY OF THE INVENTION

In accordance with the present invention, there is provided first a plurality of silicon semiconductor devices for application in digital signal processing, microprocessor, memory and other commercial and military applications requiring flexibility, high reliability and cost-effectiveness; secondly a process aiming at low-cost manufacturabilty, far reduced number of process steps and easy rework, all of which offer an economic advantage over the prior art and also avoid the generation of chemical waste byproducts which would require costly disposition; and thirdly, apparatus is provided for improving selected steps of the process.

It is an object of the present invention to provide a low-cost method and system for rerouting the circuit metal contact pads.

Another object of the present invention is to provide a method for wide assembly flexibility by using reroute metal and solder material combinations allowing a wide range of assembly temperatures.

Another object of the present invention is to simplify system rework by employing simultaneously various solder/material combinations.

Another object of the present invention is to provide a method for patterning the reroute metal so that it can operate cost-effectively in two as well as in three dimensions.

Another object of the present invention is to provide a technology for covering the small sides or edges of the chips in preparation for reliable extension of the reroute network across said small sides.

Another object of the present invention is to provide a method and apparatus for cost-effectively laminating semiconductor chips in a three-dimensional configuration to allow high density packaging.

Another object of the present invention is to provide a plurality of conductive means on the interconnect substrate compatible with the chip conductors and solder material choices.

Another object of the present invention is to develop a flexible, efficient, economical, mass producible technology for dense packaging of semiconductor chips.

These objects have been achieved by a mass-production process using a combination of thin film platinum metallization, protective dielectric masking, and three-dimensional laser ablation, in conjunction with a variety of solder combinations and melting temperatures. These combinations have been employed for the fabrication of silicon chips as well as connective substrates. Furthermore, spacing films with adhesive properties on both surfaces have been successfully used for assembling multi-chip cubes.

Other objects and features of the invention will become more readily understood from the following detailed description and appended claims when read in conjunction with the accompanying drawings, in which like reference numerals designate like parts throughout the figures thereof.

DESCRIPTION OF THE PREFERRED EMBODIMENTS

Figure 1:
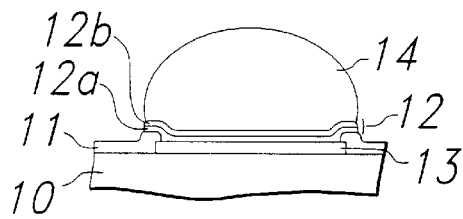
FIG. 1 illustrates a cross section of a solder bump and undermetal arrangement over the chip contact metallization, according to known technology.

Referring now to FIG. 1, based on known technology, there is shown a cross section of a semiconductor chip 10, typically silicon, protected by a dielectric protective overcoat 11, usually silicon nitride, and a patterned metallization 12 over the aluminum 13 of the circuit contact pads. Metallization 12 usually consists of a sequence of thin films, typically a refractory metal 12a, such as chromium, in contact with the aluminum 13, followed by a solderable metal 12b, such as copper, nickel or palladium. Finally, solder ball 14 is formed by reflowing the evaporated or plated solder alloy. After such attachment, solder balls are often referred to as solder "bumps". For fabricating this structure, several process flow variants, commonly referred to as "C-4", have been discussed in the literature. They comprise at least ten process steps and are thus expensive: Sputter Cr and Cu (or Ni or any of a wide selection of metals described in the literature); spin resist; bake; expose; develop; etch metal; remove resist; seed solder; evaporate or plate solder; reflow solder; flip chip attach.

Figure 2A:
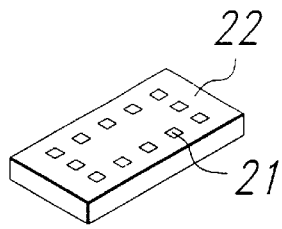
FIGS. 2 to 5 illustrate the process flow for rerouting conductive paths to circuit contact pads, according to the invention. FIGS. designated by "a" show bird's eye views, and FIGS. designated by "b" show cross sectional views.
Figure 2B:
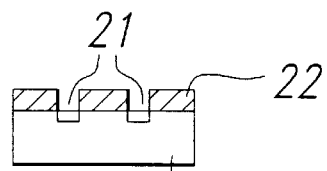
Figure 3A:
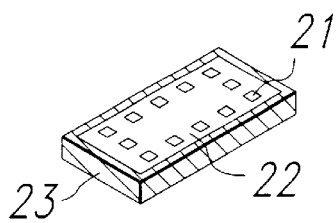
Figure 3B:
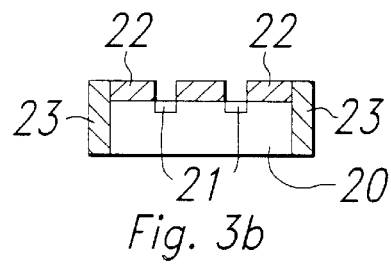

FIGS. 2a and 2b show a chip 20, made of silicon, gallium arsenide, or any other III–V or II–VI semiconductor material, having circuit contact pads 21 thereon (for example aluminum) wherein it is desired to reroute electrically conductive paths to said contact pads. The area between the circuit contact pads is covered by protective, electrically insulating overcoat 22. The rerouting is accomplished by initially sputtering, evaporating, or otherwise depositing a layer of electrically insulating and temperature tolerant material, such as inorganic compounds like silicon nitride, silicon dioxide, or silicon carbide, so that it covers the side edges 23 of the chip 20, but not the circuit surface of chip 20. This is illustrated in FIGS. 3a and 3b. By way of explanation, each chip, being a cuboid, exhibits six faces; the top face contains the integrated circuit and is often referred to as the "circuit surface"; the bottom face; and four sides around the edges, often referred to as the four "edge sides"; these edge sides are orthogonal to the top and the bottom faces of the cuboid. The process described above results in a layer of uniform thickness, although not critical.

Two different methods of area protection during deposition of the electrically insulating material are part of this invention: first, shielding of the entire circuit surface by positioning the chips with the circuit surface down, and second, protecting the circuit contact pads by selective masking. In both variations, the insulating material will be preferentially deposited on the four edge sides of the chip. Both methods are discussed in more detail below.

Figure 4A:
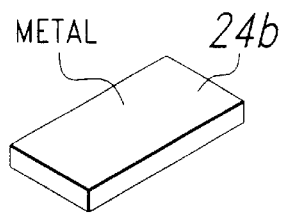
Figure 4B:
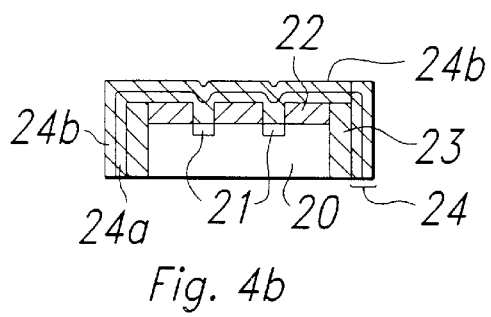

Referring now to FIGS. 4a and 4b, metal layer 24 is then deposited over the entire circuit surface and the edge sides of the chip, following the contours to make ohmic contact with the circuit metal pads 21. According to the invention, metal layer 24 is preferably fabricated by depositing onto the circuit surface and the edge sides first a layer of refractory metal 24a, such as titanium or titanium-tungsten alloy, approximately 40 to 700 nm thick (preferred thickness 50 nm), followed by a layer 24b of platinum or platinum-rich alloy, approximately 200 to 800 nm thick (preferred thickness 500 nm). In order to obtain enhanced electrical conductivity, a layer of copper (50 nm to 1000 nm thick, preferred thickness 700 nm) may precede the deposition of the platinum. Other refractory metals include chromium, molybdenum, or tungsten. The layers are preferably deposited by a sputtering process, though any technique, such as vapor deposition or evaporation, can be used which will deposit the metals on the circuit surface and the edge sides.

Furthermore, since the metal films are so thin, any mechanical stress exerted in the semiconductor chip is minimized, as compared to the considerably thicker metallization films used in the known technology; less stress translates into avoidance of semiconductor bow and of peeling of metal, and thus results in higher production yield.

Since platinum has the advantage of very low dissolution rates in liquid lead-tin solders and does not form oxides, it is the preferred choice as the undermetal for a wide variety of lead-tin solder mixtures, lead alloys or tin alloys, covering the wide range of technically useful melting or reflow temperatures from the eutectic to about 400° C.

Figure 5A:
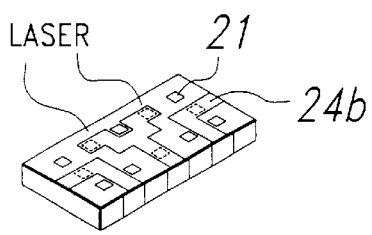
Figure 5B:
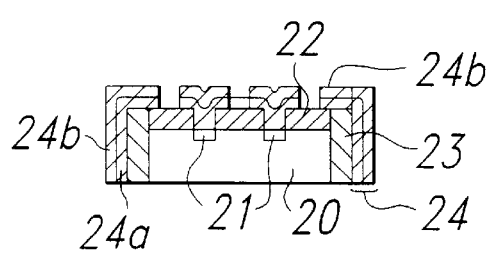
Figure 6:
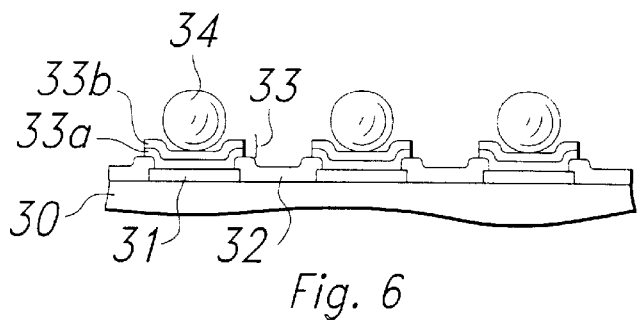
FIG. 6 illustrates a more detailed cross section through part of a semiconductor chip after deposition and patterning of the rerouting platinum and refractory metal layers.

Since both platinum layer 24b and tungsten layer 24a are thin, a laser is required as an ablation tool to pattern the layers. The invention can use two methods. In one method, a mask is provided over the metal layers. The exposed metals are ablated by an excimer laser to provide a conductor pattern on the circuit surface of the chip as well as over one or more of the edge sides of the chip, as illustrated in FIGS. 5a and 5b. The simplest embodiment of such patterning on a semiconductor circuit chip 30 is indicated by the cross section of FIG. 6, where the refractory metal layer 33a and the platinum layer 33b cover just the circuit metal contact pads 31 (typically aluminum) and a small donut-shaped area around it. The area between the metal contact pads 31 is protected by the protective overcoat 32. FIG. 6 also illustrates attaching prefabricated solder balls 34 to some contact pads before they are processed through the reflow temperature cycle.

In another method, the laser is computer-controlled and thus able to produce metal patterns of variable line widths, especially as small as chip-compatible feature sizes. With this capability, it is also possible to generate some metal line widths wide enough to become ground potential or power supply conductors which branch out into thinner connector lines in different parts of the pattern.

In either method, the employment of a laser eliminates chemical waste and the use of hazardous chemicals such as aqua regia. Furthermore, redeposition of the removed material is avoided. Consequently, the large number of process steps needed for rerouting in the known technology is reduced by the invention to only four steps: Deposit titanium and platinum; laser ablate; attach solder ball or print paste; flip chip attach.

Figure 7:
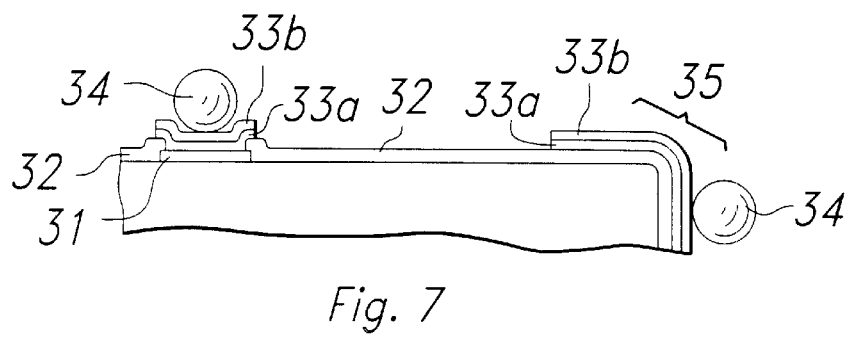
FIG. 7 illustrates a metal contact pad and a remote part of the rerouting after solder balls have been attached.

FIG. 7 illustrates the attachment of prefabricated solder balls 34 to one contact pad 31 as well as to part of a rerouted connector 35 reaching from the circuit surface to one edge side of the chip. The solder ball is shown before reflow. The fact that plating or evaporation of the solder material, as performed in the known technology, can be replaced by the use of prefabricated balls, represents a significant process simplification and cost reduction. In addition, it is a major advantage of the present invention that the very low dissolution rate of platinum into high-temperature melting solders (for instance between 300 and 400° C.) permits the use of two or more different solders for different chips. In a sequential assembly, the chip with the higher melting solder can be attached to a substrate first and will remain there fixed without reflow when a second chip with lower melting solder is attached later. Furthermore, the second chip can be reworked or replaced without affecting the attachment of the first chip. This convenient feature for easy repair may be repeated numerous times without detrimental effect on the solder quality.

Figure 8:
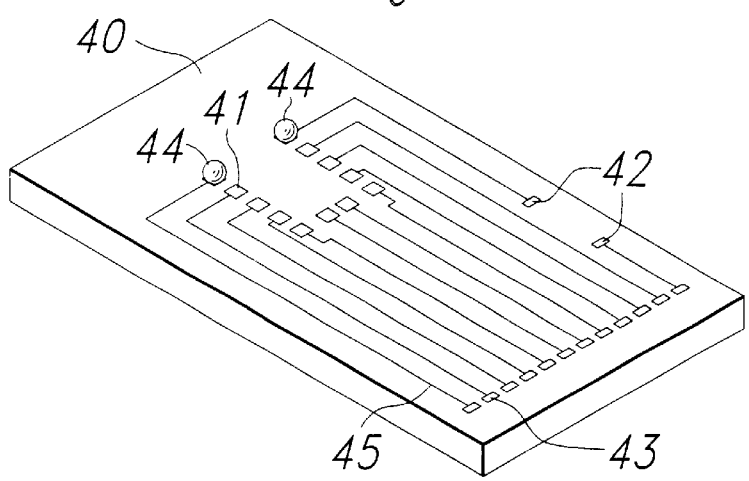
FIG. 8 illustrates the metallization on the substrate with the footprints for the connection to a semiconductor chip and a passive element.

The principal features of the process described above for semiconductor chips can also be applied to substrates made of oxidized silicon, polymer, ceramic or other materials with an insulating surface so that one or more levels of an interconnecting network of conducting paths and pads will be generated on the substrate. By way of example, FIG. 8 illustrates an interconnect substrate 40, designed for the assembly of one active semiconductor device and one passive element. Pads 41 delineate the footprint of a semiconductor device, while pads 42 delineate the footprint of a passive element, and pads 43 provide connection to circuitry off the substrate 40. The fabrication of the conductor network follows the procedure described above and illustrated in FIGS. 4a, 4b, 5a, and 5b. This means that the top surface of the conductor network consists of platinum or platinum-rich alloy. Consequently, prefabricated solder balls 44 may be applied directly to the pads of the substrate, as indicated on two of the pads 41 intended for the assembly of the semiconductor device. It furthermore implies that the feature size of the interconnecting lines 45 may be as fine as the one employed for interconnection in the semiconductor circuit.

Figure 9:
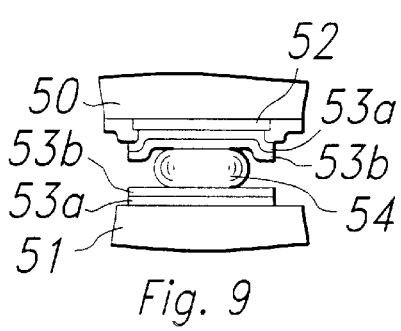
FIG. 9 illustrates the detail of a cross section through one contact between chip and substrate after reflow of the solder bump.

After assembly of a circuit contact pad 52 of the chip 50 to a substrate 51, a cross section through this single connecting junction is illustrated in FIG. 9. The chip contact pad 52, the titanium layer 53a and the platinum layer 53b, and the solder material 54 form an ohmic connecting junction.

Figure 10:
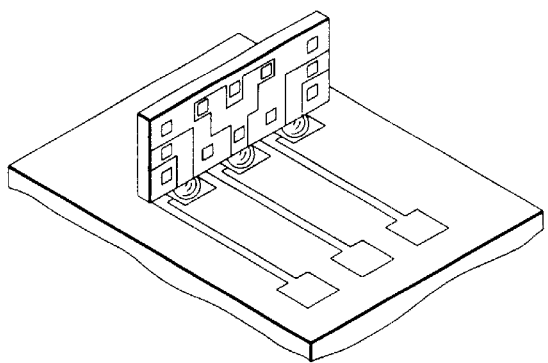
FIG. 10 illustrates the orthogonal assembly after solder reflow of a chip with metal rerouting onto a substrate with conductor pattern.

Assembling a chip, with rerouting connecting network prepared according to the invention, by one of its edge sides on a substrate, results in a product as shown in FIG. 10. In this configuration, electrical characterization and testing of the semiconductor chip can easily be performed. Thereafter, the solder connection can be reopened by reflowing the solder connection, without detrimental side effects to the chip or the substrate. This procedure, based on the invention, thus represents a low-cost method of producing a "Known Good Die"—a product which can be achieved by known technology only in cost-intensive procedures.

As mentioned above, the process of depositing the insulating material on the edge sides of the chip, while protecting the circuit surface of the chip, is an important part of this invention. To accomplish this goal by conventional methods, one would need photolithography with seven process steps: Coat photoresist; bake photoresist; expose photoresist; develop photoresist; deposit dielectric; strip photoresist; and ash to clean. The process according to the invention consists of only one step, namely to deposit the dielectric material. This simplified process is enabled by the apparatus illustrated in FIGS. 11a, 11b, 12a and 12b.

Figure 11A:
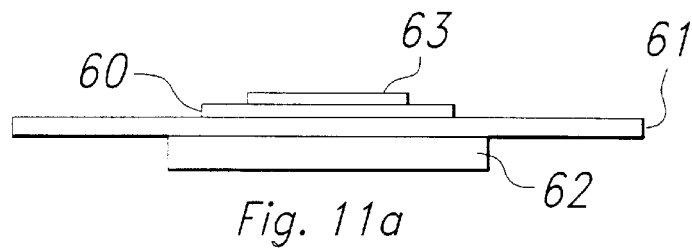
FIGS. 11a and 11b illustrate the fixture in cross section and top view respectively which allows the deposition of dielectrics over the side edges of the chip.
Figure 11B:
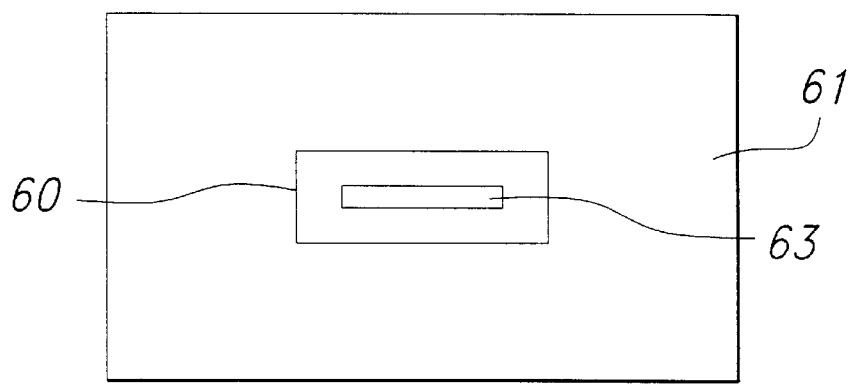
Figure 12A:
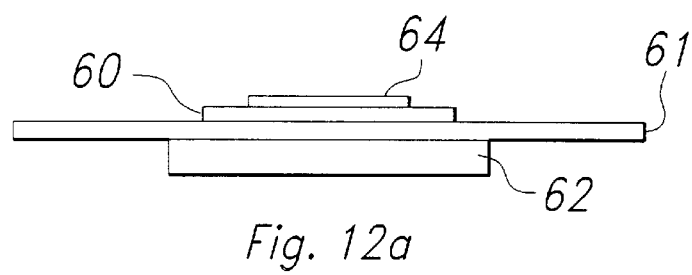
FIGS. 12a and 12b illustrate the same fixture with a modified mask, in cross section and top view respectively.
Figure 12B:
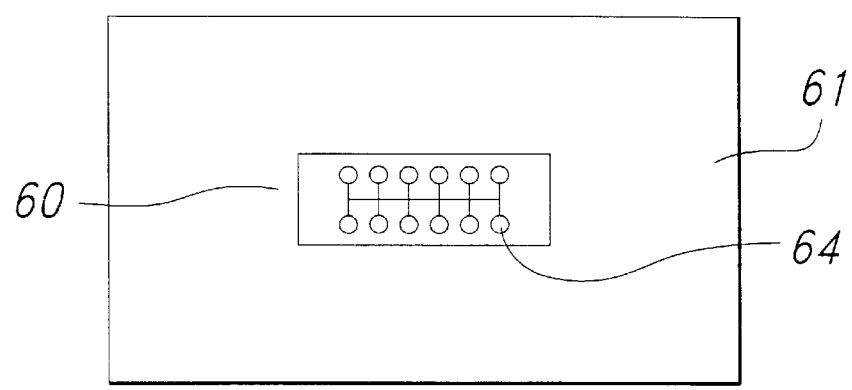

Referring now to FIGS. 11a and 11b, a chip 60 is placed on a support 61 with its circuit surface down. A magnet 62 under the support exerts force on a steel tool 63, which is placed across the inverted chip, thus pressing the chip flat against the support. Using vapor deposition as the preferred process, insulating material, such as silicon nitride, is deposited on the side edges of the chip, but substantially none on the circuit surface of the chip. Vapor deposition not only permits reliable coverage by insulating material of the edge sides, but also of the corners of the chip where the edge sides meet the circuit surface at right angles. Other suitable processes include sputtering and evaporation. Preferably, the insulating material consists of silicon nitride; other suitable choices include inorganic materials such as silicon dioxide or silicon carbide.

For the process illustrated in FIGS. 11a and b, the steel tool 63 may be shaped as a simple bar or strip. However, in another modification of this invention, the chip may be positioned on the support with its circuit surface up. In that case, the steel tool is configured to act as a mask. In addition to the edge sides, the deposition would then cover those parts of the circuit surface which are not masked by the steel tool. As an example, FIG. 12b delineates the steel tool 64 in a shape needed for memory chips with center line positioning of the circuit metal pads. In that case, the steel tool needs to mask these circuit metal pads and some selected other areas of the chip; consequently, it may have the shape of a center spine supporting fishbone-like structures of side bars with widened ends.

It is important for cost-effective mass production to employ equipment suitable for batch processing of individual chips, preferably operated by robots minimizing non-value-adding queue times.

Figure 13:
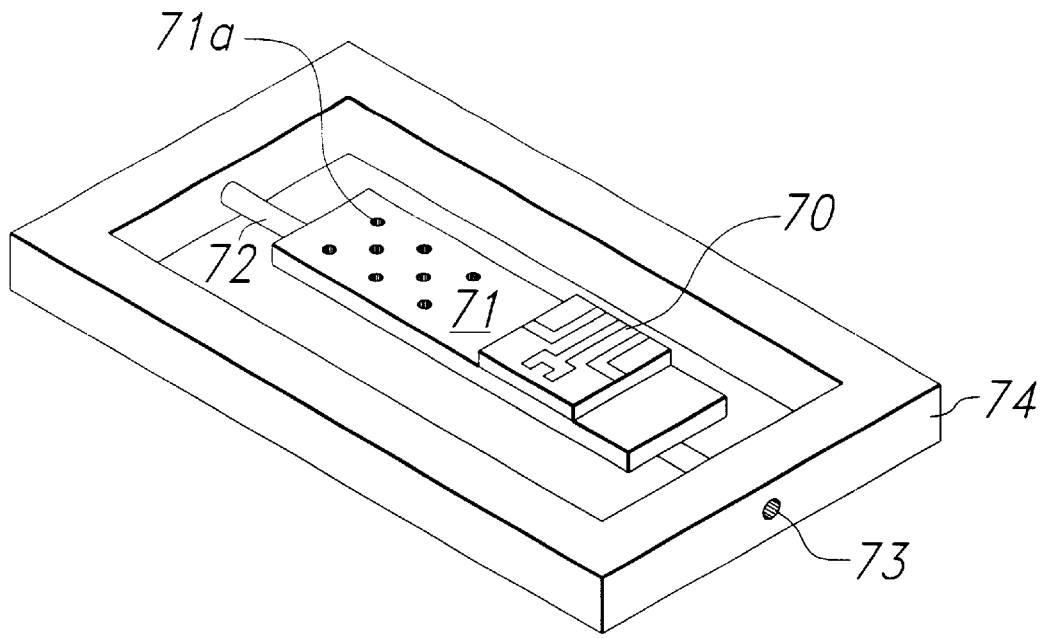
FIG. 13 illustrates the fixture for three-dimensional ablation using excimer laser.
Figure 14:
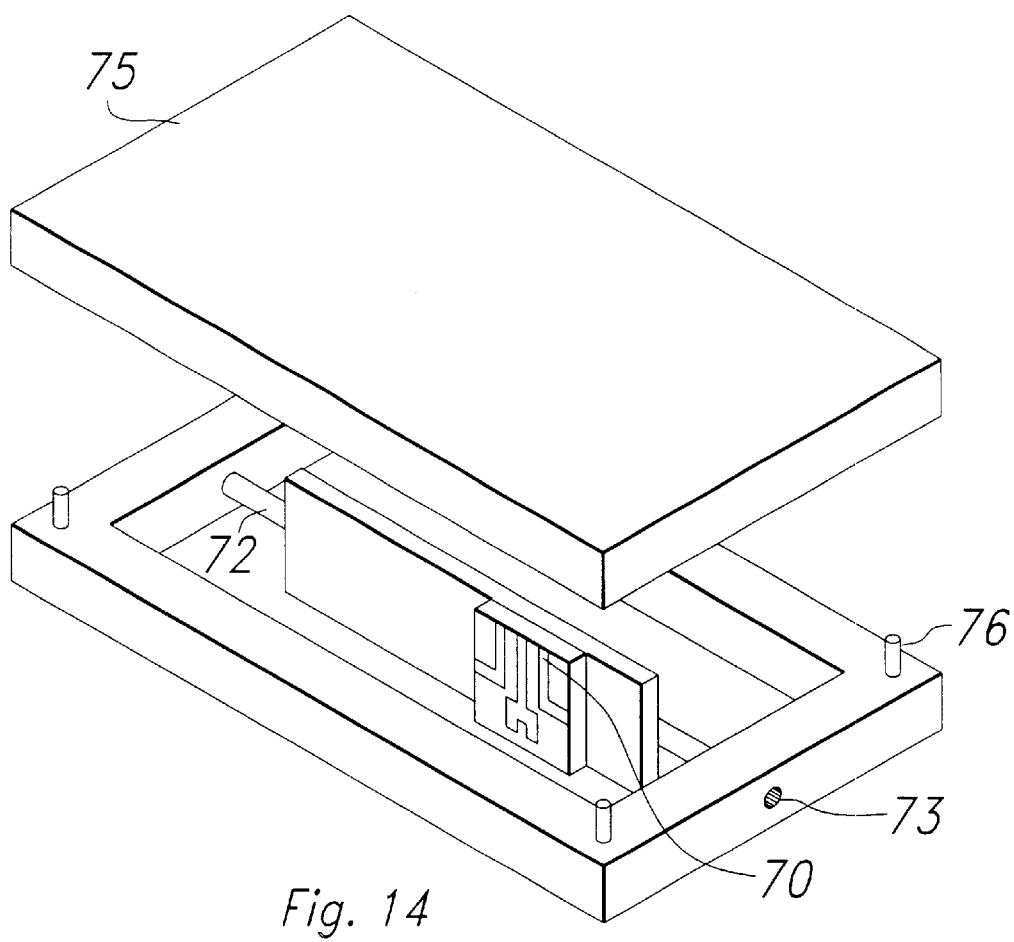
FIG. 14 illustrates the fixture for the ablation process after rotation of chip and with an additional height set tool.

One such apparatus which is an integral part of this invention is illustrated in FIGS. 13 and 14. The purpose of this apparatus is to precisely position and hold a multitude of chips so that the pattern of the thin film metal conductors can be generated. Referring now to FIG. 13, one chip 70 (out of a multitude of approximately 100) is shown on a support 71, held by the pulling force of reduced air pressure ("vacuum") supplied through numerous holes 71a opened in support 71. Loading and unloading of the chips is preferably performed by a robot. The support 71 is connected to a rod 72, held by bearings 73 in frame 74. Rod 72 can rotate around its axis for at least 90°. When rod 72 is positioned so that one edge side 70a of chip 70 faces upward, as shown in FIG. 14, the height set tool 75 is gently lowered, until it touches said chip and comes to rest on pins 76. All other chips which may be adjacent to chip 70 will be aligned simultaneously. As a result, all chips on support 71 will orient their respective edge sides in one plane (with a precision of approximately plus/minus 20 $\mu$m). The excimer laser for ablation will be focussed onto this plane. Said focus plane has been given the reference designator 77 in FIGS. 15a and 15b.

The excimer laser operates at high precision (focus considerably less than 25 $\mu$m) so that fine feature sizes of the thin rerouting metal layers can be produced, approaching the feature size of the interconnecting metallization in the semiconductor circuit. As a result, the conductors for rerouting can be generated in fine feature size even on the edge sides of the chips. Exploiting the fact that the laser is computer controlled, different widths of the metal lines can be obtained for different portions of a conductor. This capability enables various line geometries in the rerouting pattern ("variable" feature size), allowing for instance the fabrication of wider electrical ground or power supply lines before they branch off to a multitude of finer line widths for connecting to the circuit metal pads.

Figures 15A, 15B:
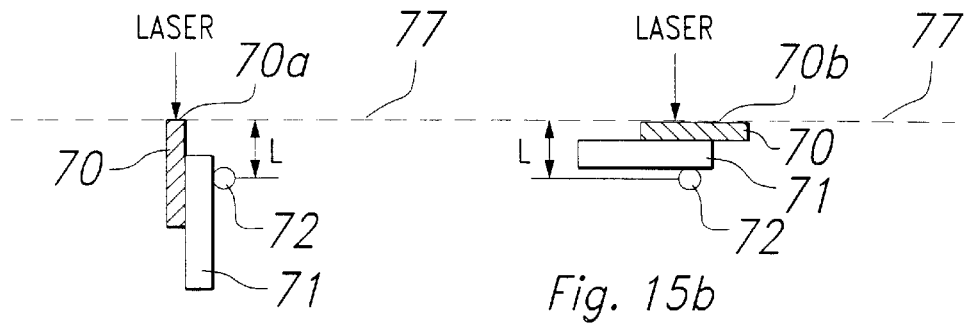
FIGS. 15a and 15b illustrate cross sections of two different chip positions in the fixture of FIG. 13 and 14 for the operation of the excimer laser.

By rotating rod 72 by 90°, the circuit surface of the chip 70 gets into the focal plane 77 of the excimer laser, as indicated in FIG. 15b. This enables the laser again to fabricate the fine features sizes of the rerouting metal pattern. It is an important characteristic of the equipment of this invention that it generates the same length referenced "L" in FIGS. 15a for the distance from the axis of rod 72 to the surface 70a of the edge side of chip 70, as it will generate the length referenced "L" in FIG. 15b for the distance from the axis of rod 72 to the surface 70b of the circuit surface of chip 70. While the excimer laser represents the preferred method to generate the fine feature size pattern for the rerouting connectors of this invention, other suitable methods include thick photoresist mask and lift-off, ion beam, and chemical etching techniques.

Figure 16A:
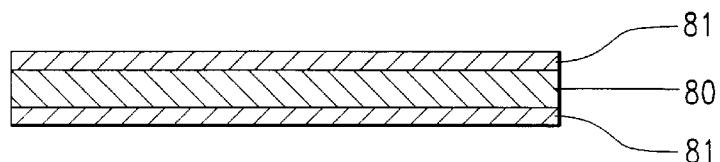
FIGS. 16 and 16b illustrate cross sections showing the adhesive polyimide film and its application for stacking a multitude of individual chips into a cube.

For stacking a multitude of chips (approximately ten or more) into a three-dimensional assembly or "cube", this invention overcomes the prime difficulty of controlling the coefficient of thermal expansion (CTE) across the cube. This difficulty dominated known technology based on liquid adhesives (epoxy or polyimide). According to this invention, a three-layered dry film (thickness range 50 to 150 μm) is used, consisting of an upilex or polyimide center (approximately 20 to 80 μm thick), with almost polymerized polyimide or acrylic adhesives on both sides (each layer approximately 20 to 40 μm thick). A cross section of such sandwich film is illustrated in FIG. 16a, showing the upilex center film 80 and the adhesive films 81. These materials are selected so that their combined CTE approximates CTE of silicon or other semiconductors as much as possible. This goal is maintained even for the high processing temperatures of high-melting solders (up to about 400° C.). Furthermore, by appropriate selection of the thicknesses of layers 80 and 81, desired electrical characteristics can be achieved for product parameters such as capacitve coupling and cross talk between conductors of the chips or the cube.

Figure 16B:
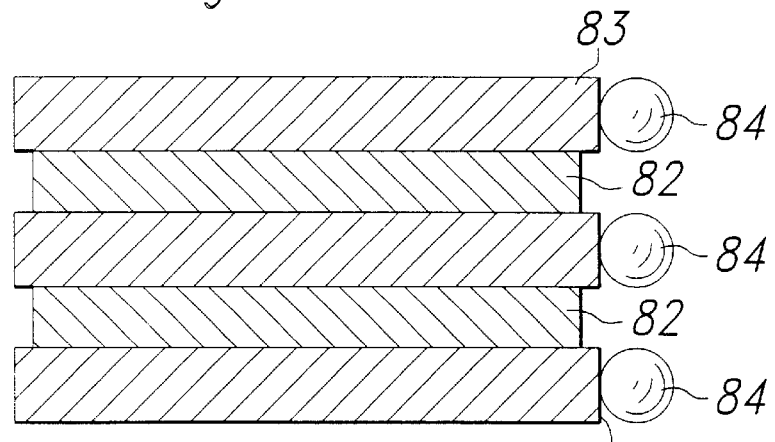

In addition, the film sandwich is chemically clean, eliminates voiding and does not bleed out-features which contribute to high product reliability. Since the adhesives are almost polymerized, they need only little time to finalize ("snap cure", less than one minute, compared to about two hours for conventional adhesives). Furthermore, since the invention obsoletes adhesive dispensing and chip picking-and-placing, only minimal labor is needed for producing the cubes, resulting in reduced manufacturing costs. It is a major advantage of this invention that the sandwich film can be cut precisely in order to obtain the exact size preform needed for manufacturing multi-chip cubes. As shown in FIG. 16b, the adhesive sandwich preforms 82 act as spacers between the rerouted chips 83, and can be assembled so that respective edge sides of the chips extend over the edge of the dielectric spacer, creating a castellated outline. This configuration enables easy attach of solder material in the shape of prefabricated balls 84 to the extended edge sides 85 of the semiconductor circuit chips. In addition, the materials of the sandwich preforms 82 have been selected so that they are insensitive to the reflow temperatures of the solder bumps.

Figure 17:
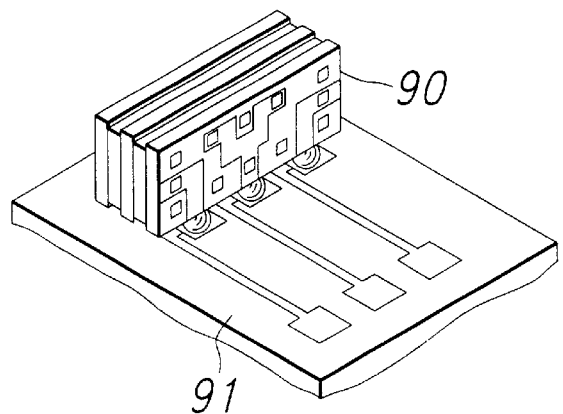
FIG. 17 illustrates a cube with rerouting and solder material for subsequent assembly onto a substrate.

FIG. 17 illustrates a three-dimensional circuit assembly in the configuration of a cube 90, fabricated as described above, after it has been soldered orthogonally onto the conductor pattern of a substrate 91, prepared according to the invention as described earlier. This method permits a high number of soldered contact points due to the thinness of the dielectric spacer and the fine feature size of the rerouted conductors on the edge side of the chips.

What is claimed is:

1. A method for the fabrication of an integrated circuit assembly comprising the steps of:

providing semiconductor circuit chip having a plurality of metal contact pads on the circuit surface thereof;

forming a plurality of patterned thin refractory metal layers connecting at least one of said pads with an edge side of said chip;

forming a thin film comprising platinum on a least one of said refractory metal layers, including an edge side portion; and connecting a solder ball to an edge side portion of said platinum—comprising film.

2. A method a in claim 1 further comprising the step of orthogonally attaching said assembly to a substrate having metal patterns thereon, by electrically connecting said solder ball with one of said substrate metal patterns.

3. A method according to claim 1 wherein said thin connecting metal layers comprise platinum or platinum-rich alloy.

4. A method according to claim 1 wherein said refractory metal layer comprises chromium, molybdenum, titanium, tungsten, or titanium-tungsten alloy.

5. A method according to claim 1 wherein said solder bumps comprise at least one alloy with a melting temperature compatible with multiple reflow.

6. A method according to claim 1 wherein said metal layers are deposited by sputtering.

7. A method according to claim 1 wherein said metal layers are patterned by laser ablation.

8. A method according to claim 1 wherein said solder material comprises prefabricated balls.

* * * * *